(12) United States Patent
Bono et al.

(10) Patent No.: US 9,960,152 B2
(45) Date of Patent: May 1, 2018

(54) OPTOELECTRONIC DEVICE WITH LIGHT-EMITTING DIODES COMPRISING AT LEAST ONE ZENER DIODE

(71) Applicant: Commissariat A L'Energie Atomique et aux Energies Alternatives, Paris (FR)

(72) Inventors: Hubert Bono, Grenoble (FR); Ivan-Christophe Robin, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days. days.

(21) Appl. No.: 15/356,034

(22) Filed: Nov. 18, 2016

(65) Prior Publication Data

US 2017/0148777 A1 May 25, 2017

(30) Foreign Application Priority Data

Nov. 20, 2015 (FR) ...................... 15 61195

(51) Int. Cl.
*H01L 25/16* (2006.01)
*H01L 25/075* (2006.01)
(Continued)

(52) U.S. Cl.
CPC ........ *H01L 25/167* (2013.01); *H01L 25/0753* (2013.01); *H01L 27/15* (2013.01);
(Continued)

(58) Field of Classification Search
None
See application file for complete search history.

(56) References Cited

U.S. PATENT DOCUMENTS

2002/0139987 A1* 10/2002 Collins, III ........... H01L 27/153
257/88
2005/0167680 A1* 8/2005 Shei ...................... H01L 25/167
257/79
(Continued)

FOREIGN PATENT DOCUMENTS

CN 104091799 A 10/2014
JP 2012-94811 5/2012
(Continued)

OTHER PUBLICATIONS

French Preliminary Search Report dated Jul. 19, 2016 in French Application 15 61195 filed on Nov. 20, 2015 (with English Translation of Categories of Cited Documents & Written Opinion).

(Continued)

*Primary Examiner* — Angel Roman
*Assistant Examiner* — Kevin Quinto
(74) *Attorney, Agent, or Firm* — Oblon, McClelland, Maier & Neustadt, L.L.P.

(57) ABSTRACT

An optoelectronic device is provided, including light-emitting diodes arranged such that: N diodes of said plurality, where N ≥2, are connected in series and are configured to be forward-biased, and at least one diode is connected in parallel to the N diodes and is configured to be reverse-biased and to form a Zener diode, wherein a sum of threshold voltages of the N diodes is less than a breakdown voltage of the Zener diode, and the light-emitting diodes include a stack of semiconductive portions including a first conductivity-type doped portion, a second conductivity-type doped portion opposite the first type, and a first intermediate portion doped according to the first type and being disposed between said first and second portions and having a doping level such that the breakdown voltage is greater than the sum of the threshold voltages of each of the N diodes.

16 Claims, 5 Drawing Sheets

(51) Int. Cl.
    *H01L 33/62*     (2010.01)
    *H01L 29/866*     (2006.01)
    *H01L 33/20*     (2010.01)
    *H01L 27/15*     (2006.01)
    *H01L 29/66*     (2006.01)
    *H01L 29/20*     (2006.01)
    *H01L 33/32*     (2010.01)
    *H01L 33/00*     (2010.01)

(52) U.S. Cl.
    CPC .... *H01L 29/2003* (2013.01); *H01L 29/66106* (2013.01); *H01L 29/866* (2013.01); *H01L 33/0075* (2013.01); *H01L 33/20* (2013.01); *H01L 33/32* (2013.01); *H01L 33/62* (2013.01); *H01L 2933/0016* (2013.01); *H01L 2933/0025* (2013.01)

(56) References Cited

U.S. PATENT DOCUMENTS

2006/0061303 A1*   3/2006   Takeda ............... H05B 33/0893
                                                                           315/300
2006/0145174 A1*   7/2006   Lee ......................... H01L 33/20
                                                                           257/98
2008/0087902 A1    4/2008   Lee et al.
2009/0272971 A1   11/2009   Lee et al.
2010/0019264 A1    1/2010   Jeong
2010/0193808 A1    8/2010   Lee et al.
2010/0244060 A1    9/2010   Lee et al.
2011/0057569 A1    3/2011   Wei et al.
2011/0175129 A1    7/2011   Lee et al.
2011/0233574 A1    9/2011   Lee et al.
2012/0091478 A1    4/2012   Lee et al.
2012/0126278 A1    5/2012   Jeong
2014/0246686 A1    9/2014   Kazama

FOREIGN PATENT DOCUMENTS

KR          10-0635346       10/2006
WO    WO 2006/098545 A2     9/2006

OTHER PUBLICATIONS

S.J. Chang et al. "Improved ESD Protection by Combining InGaN—GaN MQW LEDs With GaN Schottky Diodes," IEEE Electron Device Letters, vol. 24, No. 3, Mar. 2003, 3 Pages.

* cited by examiner

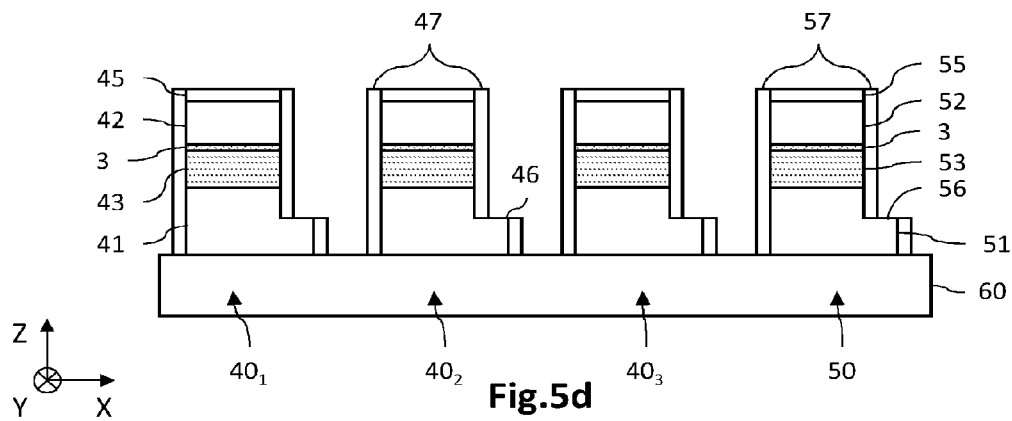
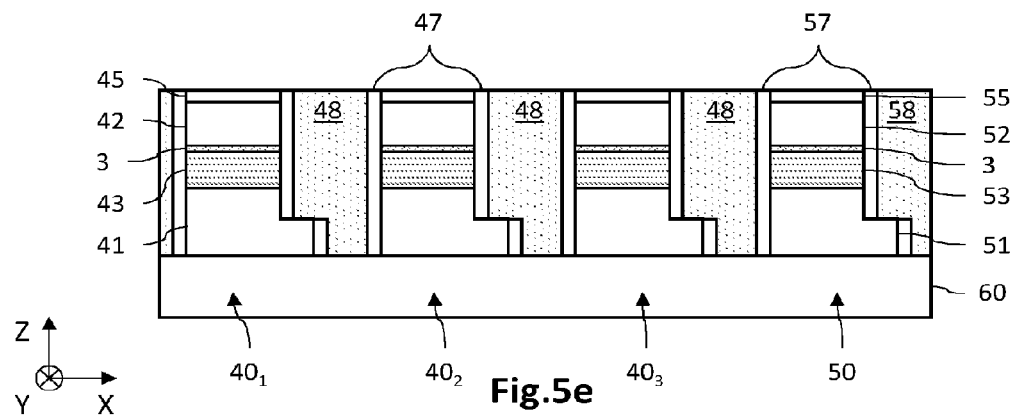
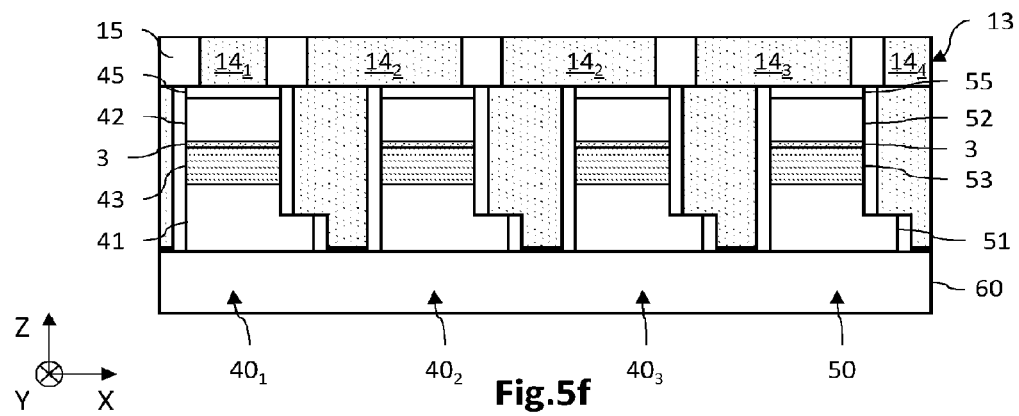

OPTOELECTRONIC DEVICE WITH LIGHT-EMITTING DIODES COMPRISING AT LEAST ONE ZENER DIODE

TECHNICAL FIELD

The field of the invention is that of the protection of ESD (Electrostatic Discharge) type for optoelectronic devices, and in particular the optoelectronic device comprising light-emitting diodes.

STATE OF THE ART

Optoelectronic devices with light-emitting diodes are known, the latter being generally formed by a stack of semiconductive layers suitable for emitting a light radiation, for example blue or ultraviolet, even green or red. The semiconductive layers are usually produced in a material mostly comprising a semiconductor compound, for example III-V, that is to say comprising elements from column III and from column V of the periodic table, such as a III-N compound, for example gallium nitride (GaN), indium and gallium nitride (InGaN) or aluminium and gallium nitride (AlGaN).

By connecting in series a plurality of light-emitting diodes, it is possible to obtain an operating voltage that is higher than the unitary operating voltage of each of the diodes, thus limiting the need to have recourse electronic elements (capacitors, converters, etc.) ensuring the adapting of the power supply voltage taken for example from the mains (for example 320V peak voltage for an alternating voltage of 230V) to the unitary operating voltage of the diodes (usually of the order of 3V).

It is important to ensure the protection of each of the light-emitting diodes connected in series with respect to voltages exhibiting an abnormally high intensity, such as the electrostatic discharges, which are likely to cause an irreversible structural degradation of the light-emitting diodes.

One solution consists generally in connecting a Zener diode in parallel to each of the light-emitting diodes, even a pair of Zener diodes connected head-to-tail. In effect, the Zener diodes exhibit a so-called reverse breakdown voltage from which they switch from a block state in which the electric current substantially does not circulate to a passing state exhibiting a very low electrical resistance. Also, when the light-emitting diodes are subjected to an abnormally high voltage, the Zener diodes go from the blocked state to the passing state such that the electrical current circulates essentially through the latter, thus preserving the light-emitting diodes from a potential irreversible structural degradation.

Usually, light-emitting diodes produced on the basis of a III-V compound, such as GaN, the threshold voltage of which is of the order of 3V, have associated Zener diodes produced on the basis of silicon, the breakdown voltage of which is of the order of 5V.

The document US2011/0057569 describes an example of an optoelectronic device comprising a plurality of light-emitting diodes connected in series and produced on the basis of GaN, where each of the light-emitting diodes is connected in parallel with a Zener diode produced on the basis of silicon, the Zener diodes being formed in a same silicon substrate.

There is however a need to have an optoelectronic device, with a simplified structure, comprising a plurality of light-emitting diodes connected in series which each benefit from a protection with respect to electrostatic discharges or equivalent voltages. There is also a need for an optoelectronic device that has a monolithic structure which allows a high density of light-emitting diodes.

SUMMARY OF THE INVENTION

The aim of the invention is to at least partly remedy the drawbacks of the prior art, and more particularly to propose an optoelectronic device comprising light-emitting diodes each exhibiting a so-called threshold forward voltage and a reverse breakdown voltage, produced in a material mostly comprising a same semiconductor compound.

According to the invention, the light-emitting diodes are arranged such that:
  a plurality of N light-emitting diodes, N>2, are connected in series and capable of being forward-biased;
  at least one light-emitting diode is connected in parallel to the plurality of the N light-emitting diodes, and capable of being reverse-biased thus forming a Zener diode;
  the number N of said light-emitting diodes connected in series being adapted such that the sum of the N threshold voltages is lower than the breakdown voltage of the Zener diode.

Certain preferred but nonlimiting aspects of this source are as follows:

The Zener diode can comprise a stack of semiconductive portions including a first portion doped according to a first type of conductivity, a second portion doped according to a second type of conductivity opposite to the first type, and a first intermediate portion doped according to the first type of conductivity, situated between said first and second doped portions, exhibiting a doping level adapted such that the breakdown voltage (Vc) is higher than the sum of the N threshold voltages (Vs).

The light-emitting diodes can comprise a stack of semiconductive portions including a first portion doped according to the first type of conductivity, a second portion doped according to the second type of conductivity, and a first intermediate portion doped according to the first type of conductivity, situated between said first and second doped portions, said semiconductive portions of the light-emitting diodes and of the Zener diode being respectively substantially coplanar and produced in a material of the same composition and of the same doping level.

The first doped intermediate portions of the light-emitting diodes and of the Zener diode can have a thickness less than or equal to 5 nm, and preferably between 1 nm and 5 nm.

The Zener diode can comprise a second intermediate portion doped according to the second type of conductivity, situated between the first doped intermediate portion and the second doped portion, exhibiting a doping level adapted such that the breakdown voltage is higher than the sum of the N threshold voltages.

The light-emitting diodes can comprise a second intermediate portion doped according to the second type of conductivity, situated between the first doped intermediate portion and the second doped portion, said second doped intermediate portions of the light-emitting diodes and of the Zener diode being respectively substantially coplanar and produced in a material of the same composition and of the same doping level, and having a thickness less than or equal to 50 nm, and preferably between 1 nm and 50 nm.

Said semiconductor compound can be chosen from a III-V compound, a II-VI compound, and a IV element or compound.

Said light-emitting diodes and the Zener diode can each have a stack of semiconductive portions comprising a first portion doped according to a first type of conductivity, an active zone, and a second portion doped according to a second type of conductivity opposite to the first type, said stacks each forming a substantially coplanar mesa structure.

The first doped portion of the light-emitting diodes and that of the Zener diode can have a lateral flank comprising a setback surface formed by a second part of the first doped portion with respect to a first part thereof.

A lateral electrical connection element can extend at the level of a light-emitting diode or of the Zener diode so as to be in electrical contact with the setback surface of the corresponding first doped portion, the lateral connection element being further electrically insulated from the second doped portions and from the active portions of the diode concerned and from the adjacent light-emitting diode or Zener diode, by dielectric portions covering lateral flanks of the mesa structures.

The invention relates also to a method for producing an optoelectronic device according to any one of the preceding features, in which:
i) light-emitting diodes are formed that are produced in a material mostly comprising a same semiconductor compound,
ii) a plurality of N light-emitting diodes, the latter being capable of being forward-biased, N>2, are connected in series;
iii) at least one light-emitting diode is connected in parallel to said plurality of N light-emitting diodes, so as to be reverse-biased thus forming a Zener diode, the number N of said light-emitting diodes connected in series being adapted such that the sum of the N threshold voltages is lower than the breakdown voltage of the Zener diode.

The step i) can comprise the substeps in which:
a. a stack of layers is produced comprising a first doped semiconductive layer and a second doped semiconductive layer between which is inserted an active layer;
b. the stack of layers is etched so as to form a mesa structure intended to form a plurality of N light-emitting diodes and a mesa structure intended to form at least one Zener diode, each mesa structure being formed by a stack of a first doped portion, an active zone and a second doped portion, the first doped portion of said mesa structures comprising a lateral flank having a setback surface;
c. dielectric portions are produced covering the lateral flanks of the mesa structures except for the setback surfaces;
d. an electrically conductive material is deposited between the mesa structures, the conductive material being in contact with the setback surface of the first doped portion and electrically insulated by dielectric portions from the active zone and from the second doped portion.

It is also possible to produce, in the step a), a first intermediate layer doped according to the first type of conductivity, situated between the active layer and the second doped layer, and preferably a second intermediate layer doped according to the second type of conductivity, situated between the first intermediate layer and the second doped layer.

It is possible to adjust the doping level of the first intermediate layer and possible that of the second doped intermediate layer such that the breakdown voltage of the Zener diode is lower than the sum of the N threshold voltages.

It is possible to produce electrical connection elements suitable for forward-biasing the plurality of the N light-emitting diodes and reverse-biasing the Zener diode from biasing electrically conductive portions situated facing the second doped portions.

BRIEF DESCRIPTION OF THE DRAWINGS

Other aspects, aims, advantages and features of the invention will become more apparent on reading the following detailed description of preferred embodiments thereof, given by way of nonlimiting example, and done so with reference to the attached drawings in which:

FIGS. 5a to 5h illustrate the steps of a method for producing an optoelectronic device according to an embodiment.

DETAILED DESCRIPTION OF PARTICULAR EMBODIMENTS

In the figures and hereinafter in the description, the same references represent identical or similar elements. Furthermore, the different elements are not represented to scale so as to favour the clarity of the figures. Moreover, the terms "substantially", "approximately", "around" should be understood to mean "to within 10%".

The invention relates to the so-called ESD (Electrostatic Discharge) protection of several light-emitting diodes connected in series with respect to electrostatic discharges or abnormally high voltages likely to irreversibly damage the structure of the light-emitting diodes.

The ESD protection is assured by at least one diode connected in parallel with the plurality of light-emitting diodes and arranged so as to be reverse-biased with respect to the plurality of light-emitting diodes. This diode is then a voltage regulator and is hereinafter called the Zener diode.

Each light-emitting diode exhibits, when forward-biased, a so-called threshold voltage Vs from which the diode emits a light radiation. The same diode, exhibits, when reverse-biased, a so-called breakdown voltage Vc, also called Zener voltage, from which the diode switches from a so-called blocking state in which the electrical current substantially does not flow (disregarding a leakage current) to a so-called passing state in which the electrical resistance of the diode is very low. The breakdown voltage Vc can be associated with a Zener effect or with an avalanche effect. The passing state of the Zener diode is effective when the reverse voltage value lies between a minimum value substantially equal to the breakdown voltage Vc and a maximum value beyond which the corresponding electrical current is likely to lead to an irreversible degradation of the structure of the diode.

Figure 1:
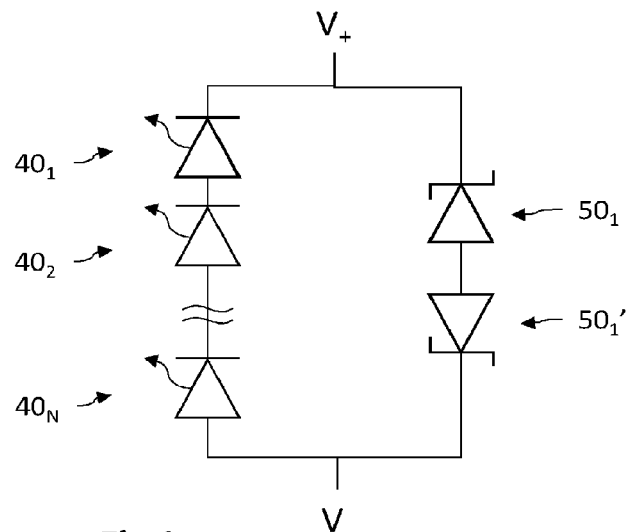
FIG. 1 illustrates an equivalent circuit diagram of an optoelectronic device comprising a plurality of light-emitting diodes connected in series, the diodes being voltage-regulated by two Zener diodes connected head-to-tail.

FIG. 1 is an example of an equivalent circuit diagram of an optoelectronic device according to an embodiment, in which a Zener diode ensures the electrical regulation of a plurality of N light-emitting diodes, N≥2, connected in series.

The optoelectronic device comprises light-emitting diodes, each exhibiting a threshold forward voltage Vs and a reverse breakdown voltage Vc, produced in a material mostly comprising the same semiconductor compound. A material mostly comprising the same semiconductor compound should be understood to be a material of which at least 50% of the volume thereof is formed by or comprises said semiconductor compound.

The semiconductor compound is chosen from the III-V compounds, that is to say mainly comprising at least one element from column III and one element from column V of the periodic table, the II-VI compounds, and the IV elements or compounds. The III-V compound can be a III-N compound, such as, for example, GaN, InGaN, AlGaN, AlN, InN, AlInGaN. The examples from column V, such as arsenic or phosphorous, can be present in a compound of the InP or InGaAs type. The II-VI compound can be, for example, ZnO, CdTe or CdHgTe. The IV compound can be, for example, SiC, diamond (C), SiGe, GeSn even SiGeSn.

Thus, because the light-emitting diodes are produced in a material mostly comprising the same semiconductor compound, they all exhibit a substantially identical threshold voltage Vs value and a substantially identical breakdown voltage Vc value.

It appears that the light-emitting diodes produced in a material mostly comprising such a semiconductor compound exhibit a reverse breakdown voltage higher than at least two times the threshold forward voltage. As an example, the publication by Chang et al., entitled *Improved ESD Protection by Combining InGaN—GaN MQW LEDs With GaN Schottky Diodes*, IEEE Electron Device Letters, vol. 24, no. 3, 2003, 129-131, describes a light-emitting diode based on GaN whose breakdown forward voltage is approximately 170V whereas the threshold forward voltage is of the order of 3V to 5V.

It is then possible to use one of the light-emitting diodes, reverse-biased, thus forming a Zener diode which ensures the electrical regulation of a plurality of the light-emitting diodes connected in series. Thus, the light-emitting diodes of the optoelectronics device are arranged so as to form, on the one hand, a plurality of N light-emitting diodes $40_1$, $40_2$, ... $40_N$ connected in series, N≥2, and, on the other hand, at least one light-emitting diode connected in parallel to said plurality of light-emitting diodes, and arranged so as to be reverse-biased, thus forming the Zener diode.

Furthermore, the number N of light-emitting diodes connected in series is then adapted such that the sum of the N threshold forward voltages is lower than the breakdown voltage Vc of the Zener diode:

$$\Sigma_1^N Vs < Vc$$

Preferably, the number N of light-emitting diodes is also adapted such that the breakdown voltage is lower than 2 times, preferably 1.5 times and even more preferably 1.25 times the sum of the N threshold forward voltages. The ESD protection of the light-emitting diodes connected in series is then improved thereby.

Thus, in operation, a bias voltage is applied to the plurality of light-emitting diodes with a value Vp on the one hand lower (in absolute value) than the breakdown voltage Vc such that the Zener diode is in the blocked state, and on the other hand higher than the sum of the N threshold voltages such that the light-emitting diodes emit a light radiation.

$$\Sigma_1^N Vs < Vp < Vc$$

When an electrostatic discharge occurs, the voltage then exhibits a value higher than the sum of the N threshold voltages but also higher than the breakdown voltage. The Zener diode then switches from the blocked state to the passing state, which makes it possible to avoid having the electrical current pass through the light-emitting diodes and provoking an irreversible degradation of the structure thereof.

In this example, the Zener diode 50 is connected in series and head-to-tail with a second Zener diode 50' so as to ensure an electrical regulation regardless of the sign of the electrostatic discharge voltage. Head-to-tail connection should be understood to mean that the two Zener diodes are connected in series at their respective anode (as illustrated) or at their respective cathode.

As an example, the light-emitting diodes and the Zener diode are produced in a material mostly comprising the compound GaN and exhibit a same threshold forward voltage, equal to about 3V, and the same reverse breakdown voltage value, equal to about 170V. The optoelectronic device can thus comprise, in parallel with the Zener diode, between approximately 29 and 57 light-emitting diodes connected in series, and preferably between approximately 37 and 57 light-emitting diodes, and even more preferably between approximately 45 and 57 light-emitting diodes, for example 50 light-emitting diodes.

Figure 2:
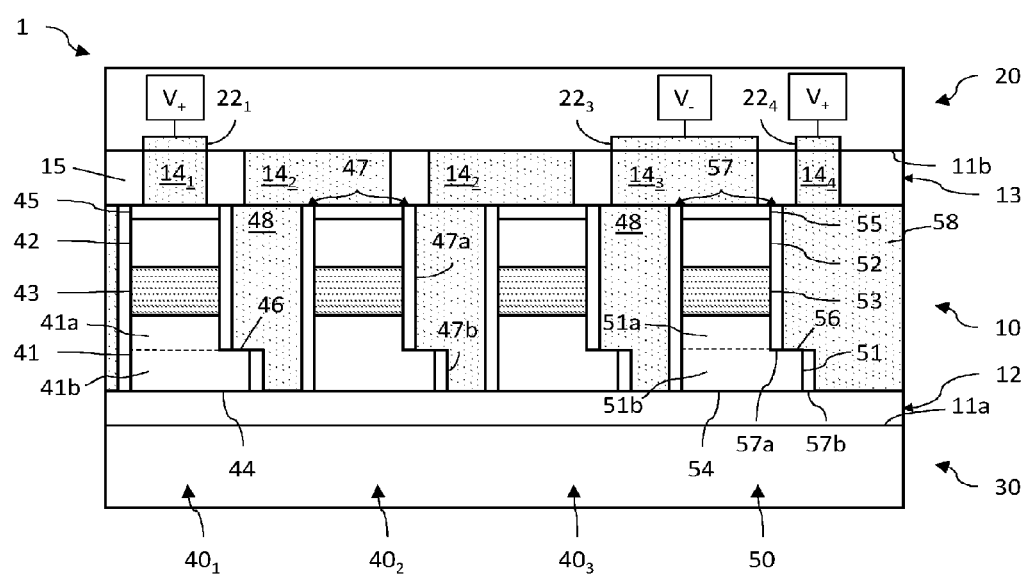
FIG. 2 is a schematic and cross-sectional partial view of an optoelectronic device according to an embodiment, in which the light-emitting diodes and the Zener diode each have a coplanar mesa structure.

FIG. 2 is a partial schematic cross-sectional view of an optoelectronic device according to an embodiment, here comprising three light-emitting diodes (for purely illustrative purposes) connected in series and voltage-regulated by a Zener diode in parallel.

A three-dimensional orthonormal reference frame (X, Y, Z) is defined here and for the rest of the description, in which the plane (X, Y) is substantially parallel to the plane of the emission surfaces of the light-emitting diodes, and in which the axis Z is oriented in a direction orthogonal to the emission surfaces.

The optoelectronic device 1 here comprises:
a first printed circuit chip 10, called optoelectronic chip, comprising a plurality of light-emitting diodes 40 connected in series, and at least one Zener diode 50 here arranged adjacent to one of the light-emitting diodes. The optoelectronic chip 10 here comprises a matrix of light-emitting diodes 40 defining a matrix of light pixels.
a second printed circuit chip 20, called control chip, arranged on a so-called rear face 11b of the optoelectronic chip 10. The control chip 20 comprises connection elements making it possible to bias the light-emitting diodes 40 and the Zener diode 50.
a cap 30, arranged on a so-called front face 11a of the optoelectronic chip 10, opposite the rear face 11b.

The optoelectronic chip 10 comprises a plurality of light-emitting diodes 40 connected in series, and at least one Zener diode 50 connected in parallel with the plurality of diodes 40. Each of the diodes 40, 50 is formed by a stack of semiconductive portions each mostly comprising the same semiconductor compound. The diodes 40, 50 thus comprise a first portion doped with a first type of conductivity and a second portion doped with a second type of conductivity between which is situated an active zone. The active zone is the region of a light-emitting diode from which a light radiation is mostly emitted.

The light-emitting diodes 40 and the Zener diode 50 form mesa structures that are substantially coplanar to one another. A mesa structure should be understood to be a structure formed by a stack of semiconductive portions of which the active zone protrudes above a growth substrate following an etching step. The structure of the light-emitting diodes and of the Zener diode can be identical or similar to the structure described in the publication by Fan et al entitled *III-nitride microemetter arrays development and applications*, J. Phys. D: Appl. Phys. 41 (2008) 094001. As a variant, as illustrated in FIG. 2, it can be identical or similar to the structure described in the patent application FR1456085 filed on 27 Jun. 2014, the text of which is considered to form an integral part of the present description. The mesa structures are substantially coplanar in as much as the semiconductive portions of the light-emitting diodes and those of the Zener diode are mutually coplanar.

Each light-emitting diode 40 comprises a stack formed by a first portion 41 doped with a first type of conductivity, for example of N type, and a second portion 42 doped with a second type of conductivity opposite to the first type, for example of P type between which is inserted a so-called emissive active zone 43 in which the light radiation of the diode is generated. A side of the N doped first portion 41, opposite to the active zone 43, forms an emission surface 44 through which the light radiation is emitted.

The Zener diode 50 comprises a stack formed by a first portion 51 doped with a first type of conductivity, for example of N type, and by a second portion 52 doped with a second type of conductivity opposite to the first type, for example of P type, between which is inserted an active zone 53. A face 54 of the N-doped first portion 51, opposite the active zone 53, is substantially coplanar with the emission surfaces 44.

In this example, each semiconductive portion 41, 42, 43 of the light-emitting diodes 40 is respectively coplanar with that 51, 52, 53 of the Zener diode 50, and have a thickness and a composition that are substantially identical. More specifically, the N-doped first portions 41 of the light-emitting diodes 40 are coplanar with that 51 of the Zener diode 50, and have a thickness and a composition that are substantially identical. A material of the same composition should be understood to be a material comprising a semiconductor compound whose elements exhibit a substantially identical atomic proportion. The doping level is preferably also substantially identical. The same applies for the P-doped second portions 42, 52 and for the active zones 43, 53. Thus, the thicknesses of the light-emitting diodes and of the Zener diodes are substantially identical. Moreover, the emission surface 44 and the surface 54 are substantially coplanar. Each light-emitting diode 40 and Zener diode 50 further comprises an electrically conductive portion 45, 55 in contact with a face of the second doped portion 42, 52 opposite the active zone 43, 53. The thickness of the conductive portion 45, 55 can be between 3 nm and 500 nm. The conductive portions 45, 55 are preferably substantially coplanar.

Each light-emitting diode 40 and Zener diode 50 here exhibits a structuring of the N-doped first portion 41, 51 forming a setback at the level of a lateral flank of the stack reflected in a local widening of the lateral dimensions in the plane (X, Y). More specifically, each N-doped first portion 41, 51 comprises a first part 41*a*, 51*a*, situated between the active zone 43, 53 and a second part 41*b*, 51*b*, the lateral dimensions of which are substantially identical to those of the active zone 43, 53. It also comprises a second part 41*b*, 51*b*, of which the face opposite the first part 41*a*, 51*a* forms the surfaces 44, 54, the lateral dimensions of which are greater than those of the first part 41*a*, 51*a* on a lateral flank of the stack. Thus, the N-doped first portion 41, 51 of the diodes 40, 50 comprises a setback surface 46, 56 which extends substantially orthogonally to the axis Z and which links the lateral flanks of the first parts 41*a*, 51*a* and second parts 41*b*, 51*b*. Moreover, the active zone 43, 53 and the P-doped second portion 42, 52 of the diodes 40, 50 comprise lateral flanks which extend continually along the axis Z. The lateral dimensions of the second part 41*b*, 51*b* of the N-doped first portion 41, 51 are greater by at least 1% than those of the first part 41*a*, 51*a*. For example, for a width of the first part 41*a*, 51*a* of the 80 μm N-doped portion, the width of the second part 41*b*, 51*b* can be 85 μm.

The light-emitting diodes 40 and Zener diode 50 can have a thickness between 100 nm and 50 μm, the thickness of the N-doped first portion 41, 51 can be between 50 nm and 20 μm, that of the active zone 43, 53 can be between 10 nm and 500 nm, and that of the P-doped second portion 42, 52 can be between 50 nm and 20 μm. The lateral dimensions of the diodes, measured on the surfaces 44, 54, can be between 500 nm and a few millimetres, depending on the applications targeted. Preferably, the lateral dimensions of the light-emitting diodes are substantially identical to those of the Zener diode.

The light-emitting diodes and Zener diode are here produced in a material mostly comprising the compound GaN. The active zones can comprise at least one quantum well produced on the basis of a semiconductor compound exhibiting a stop band energy lower than that of the doped portions. As an example, the doped portions are produced in GaN and the active zone comprises an alternation of intrinsic semiconductive layers (not intentionally doped) of GaN and at least one InGaN-based quantum well. As an illustration, the light-emitting diodes can be adapted to emit a blue light, that is to say with an emission spectrum that exhibits a peak of intensity lying between approximately 440 nm and 490 nm.

The lateral flanks of the diodes are coated with a dielectric portion 47, 57, except for the setback surfaces 46, 56. More specifically, the lateral flanks that do not comprise any setback are covered continuously with a dielectric portion 47, 57. The lateral flanks comprising a setback are coated with a dielectric portion in two parts: a first part 47*a*, 57*a* which covers the lateral flanks of the P-doped portion 42, 52, of the active zone 43, 53 and of the first part 41*a*, 51*a* of the N-doped portion 41, 51; and a second part 47*b*, 57*b*, distinct from the first, which covers the lateral flanks of the second part 41*b*, 51*b* of the N-doped portion 41, 51. Thus, the setback surfaces 46, 56 are not coated with a dielectric portion 47, 57. The dielectric portion 47, 57 also covers the lateral flanks of the conductive portion 45, 55.

The optoelectronic chip further comprises so-called lateral electrical connection elements 48, 58, inserted between the light-emitting diodes 40 and Zener diode 50, adapted to bring to an electrical potential respectively the N-doped first portion 41, 51. In this example, the lateral connection elements 48 extend between a dielectric layer 12 and an electrical coupling layer 13. Each light-emitting diode 40 thus comprises a lateral connection element 48 which extends between the dielectric portion 47*a*, 47*b* situated at the level of the setback 46 on the one hand, and the dielectric portion 47 or 57 of the facing diode on the other hand. The lateral connection element 48 is therefore electrically insulated from the active zones 43, 53 and from the p-doped second portions 42, 52 of the light-emitting diodes 40 and of the Zener diode 50. It is however in electrical contact with the N-doped first portion 41 of the corresponding light-emitting diode 40 at the level of the setback surface 46, so as to be able to bring the N-doped first portion 41 to a given electrical potential.

Similarly, each Zener diode 50 comprises a so-called lateral connection element 58 suitable for bringing the N-doped first portion 51 to a given electrical potential. It extends between the dielectric portion 57a, 57b situated at the level of the setback 56 on the one hand, and the dielectric portion 47 of a facing light-emitting diode 40. The lateral connection element 58 is therefore electrically insulated from the active zones 43, 53 and from the p-doped second portions 42, 52. It is however in electrical contact with the N-doped first portion 51 of the Zener diode at the level of the setback surface 56, so as to be able to bring this N-doped first portion 51 to a given electrical potential.

The lateral connection elements 48, 58 are electrically insulated from the conductive portions 45, 55 by the dielectric portions 47, 57. The thickness and the material of the dielectric portions 47, 57 are chosen so as to obtain an acceptable leakage current between the conductive portion and the lateral connection elements. The thickness can be of the order of a few nanometres, for example be between 3 nm and 5 nm depending on the dielectric material used.

In this example, the optoelectronic device can comprise a dielectric layer 12 inserted between the light-emitting diodes 40 and Zener diode 50 on the one hand and the cap 30 on the other hand. It is produced in a dielectric material, for example $Si_3N_4$, so as to avoid any short-circuit between the diodes 40, 50 and the corresponding lateral connection elements 48, 58, and can improve the light extraction. The thickness of the dielectric layer 12 is for example between 500 nm and 50 µm, preferably between 1 µm and 5 µm. It comprises a front and an opposite rear face. The light-emitting diodes 40 and the Zener diode 50 are in contact with the rear face of the dielectric layer 12 at the respective surfaces 44, 54. The front face can have relief patterns (not represented) situated facing the emission surfaces 44 so as to improve the extraction of the light radiation emitted by the light-emitting diodes 40.

The optoelectronic device can further comprise an electrical coupling layer 13 inserted between the diodes 40, 50 and the control chip 20, simplifying the electrical connection between the optoelectronic chip and the control chip. The coupling layer 13 thus comprises electrical connection elements 14 ensuring the connection between the lateral connection elements 48, 58 with conductive portions of the control chip. The connection elements 14 are electrically insulated from one another by a dielectric material 15. The coupling layer 13 has a substantially constant thickness, of which a face opposite the diodes 40, 50 forms the rear face 11b of the optoelectronic chip.

The electrical connection elements 14 here ensure the series connection of the light-emitting diodes 40 and the parallel connection thereof with the Zener diode 50, and allow the application of given electrical potentials. For that:
- an element $14_1$ is in electrical contact with the conductive portion 45 of a first light-emitting diode $40_1$ so as to be able to apply a positive electrical potential here denoted $V_+$, to the corresponding anode 42;
- elements $14_2$ ensure the series connection of the light-emitting diodes $40_1$, $40_2$, $40_3$, and thus link the cathode 41 of an upstream diode 40 to the anode 42 of the downstream diode 40. For that, they are in electrical contact with the element 48 of the upstream diode 40 and with the conductive portion 45 of the downstream diode 40;
- an element $14_3$ is in electrical contact with the element 48 of the last light-emitting diode $40_3$ so as to apply a negative electrical potential, here denoted $V_-$, the corresponding cathode 41. Advantageously, this same element $14_3$ is also in contact with the conductive portion 55 of the Zener diode 50 so as to apply the same electrical potential to the anode 52 of the Zener diode;
- finally, an element $14_4$ is in electrical contact with the element 58 of the Zener diode 50 so as to be able to apply the same electrical potential $V_+$ to the cathode 51.

The light emission optoelectronic device further comprises a control chip 20 assembled with the optoelectronic chip 10 on the rear face 11b. The control chip ensures the electrical biasing of the diodes 40, 50. Thus, the conductive portions 22 ensure the forward biasing of the light-emitting diodes 40 and the reverse biasing of the Zener diode 50. More specifically, a positive electrical potential $V_+$ is applied to the anode 42 of the first light-emitting diode $40_1$ via the connection element $14_1$ and a negative electrical potential $V_-$ is applied to the cathode 41 of the last light-emitting diode $40_3$ via the connection element $14_3$. Furthermore, the same negative potential $V_-$ is applied to the anode 52 of the Zener diode 50 via the connection element $14_3$ and the same positive potential $V_+$ is applied to the cathode 51 of the Zener diode 50 via the connection element $14_4$. The light-emitting diodes connected in series are therefore forward-biased and the Zener diode is reverse-biased.

The control chip can also comprise electronic elements, of transistor type, ensuring the transmission control of the light-emitting diodes. Alternatively, it can be a passive component comprising essentially only electrical connection lines from the conductive portions to remote electronic elements.

The optoelectronic device also comprises a cap 30 formed here by a plate material transparent to the spectral range of the light radiation emitted by the light-emitting diodes. The transparent plate here covers the front face of the dielectric layer.

Thus, an optoelectronic device is obtained in which the plurality of light-emitting diodes connected in series is protected against the electrostatic discharges by at least one diode forming a Zener diode mostly comprising the same semiconductor compound. It is therefore an optoelectronic device with built-in protection for which the number of Zener diodes necessary to ensure that ESD protection of the light-emitting diodes is reduced compared to that of the prior art example cited previously.

Moreover, the coplanar mesa structuring with setback of the light-emitting diodes and of the Zener diode makes it possible to obtain a high density of diodes, with lateral dimensions of the diodes that can be of the order of 10 µm to 50 µm. The electrical connection of the diodes is also simplified, while ensuring a good electrical insulation between the electrical connection elements.

Finally, the optoelectronic device comprises light-emitting diodes and at least one Zener diode integrated in a monolithic manner, that can be obtained simultaneously by a fabrication method as detailed later.

Figure 3:
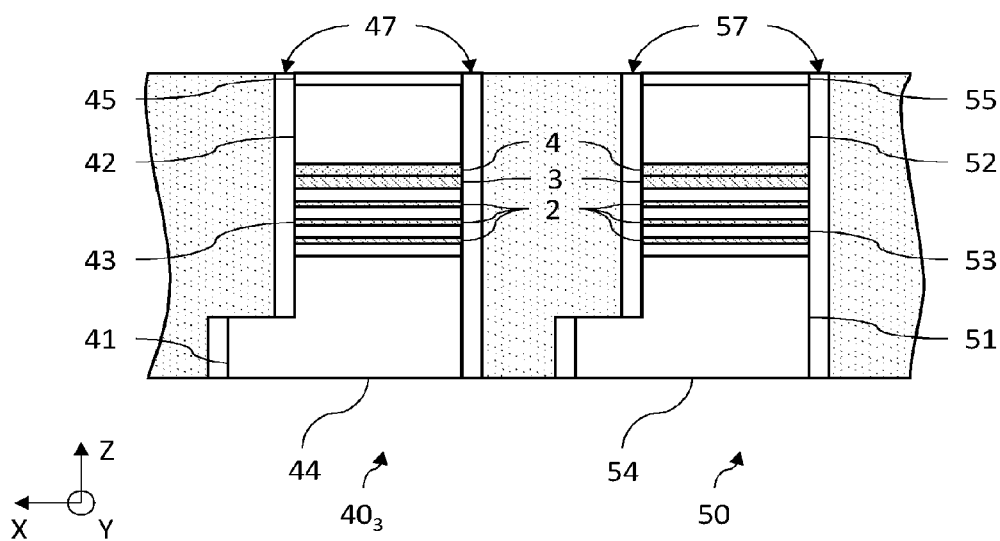
FIG. 3 is a detailed schematic view of the stack of semiconductive portions of a light-emitting diode and of the Zener diode of an optoelectronic device according to a variant of the embodiment illustrated in FIG. 2, comprising doped intermediate portions situated between the active zone and the second doped portion.

FIG. 3 is a detailed cross-sectional schematic view of a light-emitting diode and of a Zener diode of an optoelectronic device according to a variant of the embodiment described previously.

In this example, the control chip 20 and the cap 30 (not represented) are identical or similar to these described with reference to FIG. 2. The light-emitting diodes 40 and the Zener diodes 50 have a coplanar mesa structure similar to that described with reference to FIG. 2.

The stack of semiconductive portions of the Zener diode is adapted to be able to adapt the value of the reverse breakdown voltage. For that, the Zener diode 50 comprises a first intermediate portion 3 doped according to the type of conductivity of the first doped portion 51, for example of N type, situated between the active zone 53 and the second doped portion 52, and produced in a material mostly comprising the same semiconductor compound as that of the diodes.

By adjusting the doping of the first doped intermediate portion 3, it is thus possible to modify the value of the reverse breakdown voltage, notably as a function of the number N of light-emitting diodes that are to be connected in series.

By way of example, for a Zener diode produced on the basis of GaN comprising a first N-doped portion 51 and a second P-doped portion 52, both portions exhibiting a doping level of the order of $10^{19}$ cm$^{-3}$, of which the active zone 53 comprises multiple quantum wells in InGaN inserted between intrinsic GaN barrier layers (not intentionally doped), the first N-doped intermediate portion 3, here produced in GaN, exhibits a doping level $N_d$ leading to a breakdown voltage value Vc indicated in the table below:

| $N_d$ (donors/cm$^3$) of the portion 3 | Vc (V) of the Zener diode 50 |
|---|---|
| $5 \cdot 10^{18}$ donors/cm$^3$ | 30 V |
| $1 \cdot 10^{19}$ donors/cm$^3$ | 20 V |
| $5 \cdot 10^{19}$ donors/cm$^3$ | 18 V |

It is then possible to connect in series a number N of light-emitting diodes as a function of the value obtained for the Zener diode breakdown voltage.

Furthermore, when the first N-doped intermediate portion 3 has an average thickness, measured in the direction Z, less than approximately 5 nm, and preferably between 1 nm and 5 nm, the doping level $N_d$ does not substantially modify the optoelectronic behaviour of the Zener diode 50 in forward mode. Thus, the value Vs of the threshold forward voltage remains substantially constant at a value here of 3.2V and the maximum internal quantum efficiency remains also substantially constant at a value here of 70%. This is all the more advantageous when, as illustrated by FIG. 3, the first N-doped intermediate portion 3 is also present in each of the light-emitting diodes 40 connected in series, the first intermediate portions 3 then being coplanar and produced in a material of the same composition and of the same doping level.

Moreover, the Zener diode can further comprise a second doped intermediate portion 4 according to the same conductivity type as that of the second doped portion 52, for example of P type. The second P-doped intermediate portion 4 is situated between the second P-doped portion 52 and the first N-doped intermediate portion 3. By adjusting the doping level $N_a$ of the second P-doped intermediate portion 4, it is also possible to modify the value of the reverse breakdown voltage.

By way of example, for a Zener diode produced on the basis of the GaN comprising a first N-doped portion 51 and a second P-doped portion 52, both portions exhibiting a doping level of the order of $10^{19}$ cm$^{-3}$, of which the active zone 53 comprises multiple quantum wells in InGaN inserted between intrinsic GaN barrier layers (not intentionally doped), the first intermediate portion 3 being produced in N-doped GaN with a doping level $N_d$ of the order of $10^{19}$ cm$^{-3}$, the second intermediate portion 4, here produced in GaN, having a doping level $N_a$, a Zener diode breakdown voltage value Vc indicated in a table below is obtained:

| $N_a$ (acceptors/cm$^3$) of the portion 4 | Vc (V) of the Zener diode 50 |
|---|---|
| $1 \cdot 10^{18}$ acceptors/cm$^3$ | 70 V |
| $5 \cdot 10^{18}$ acceptors/cm$^3$ | 30 V |
| $1 \cdot 10^{19}$ acceptors/cm$^3$ | 20 V |

It is then possible to connect in series a number N of light-emitting diodes as a function of the breakdown voltage value obtained for the Zener diode.

Furthermore, when the second p-doped intermediate portion 4 has an average thickness, measured in the direction Z, less than approximately 50 nm, and preferably between 1 nm and 50 nm, the doping level $N_a$ does not substantially modify the optoelectronic behaviour of the Zener diode 50 in forward mode. Thus, the value Vs of the threshold forward voltage remains substantially constant at a value here of 3.2 V and the maximum internal quantum efficiency remains also substantially constant at a value here of 70%. This is all the more advantageous when, as illustrated by FIG. 3, the second P-doped intermediate portion 4 is also present in each of the light-emitting diodes 40 connected in series, the second intermediate portions 4 then being coplanar and produced in a material of the same composition and of the same doping level.

The doping level of the first and second doped intermediate portions 3, 4 can be uniform within the portions or exhibit a doping gradient. In this case, the doping level indicated previously corresponds to an average doping level within each of the portions 3, 4.

The stack of semiconductive portions of the Zener diode and of the light-emitting diodes can comprise an electron blocking portion situated between the active zone 43, 53 and the second doped portion 42, 52, and preferably between the doped intermediate layers 3, 4 and the second doped portion 42, 52. The electron blocking portion can be formed in a material mostly comprising the same semiconductor compound as the diodes 40, 50. It makes it possible to increase the rate of radiative recombinations within the active zone. In the case of diodes 40, 50 produced on the basis of GaN, the electron blocking portion can be produced in AlGaN, preferably with an atomic proportion of aluminium of between approximately 10% and 20%. Advantageously, the first intermediate portion 3 and preferably also the second intermediate portion 4 can be produced in AlGaN so as to also ensure the electron blocking function.

Finally, as an alternative to the use of the doped intermediate portions 3, 4, the modification of the doping levels of the second doped portion 52 makes it possible also to adjust the breakdown voltage value, when the active zone 53 is doped to a sufficient level and of type N, for example of the order of $5 \cdot 10^{18}$ cm$^3$. However, when the doped portions 41, 42 and the active zone 43 of the light-emitting diodes exhibit a doping level that is identical to the modified doping level of the portions 51, 52, 53 of the Zener diode, the internal quantum efficiency presents a reduced value.

Figure 4:
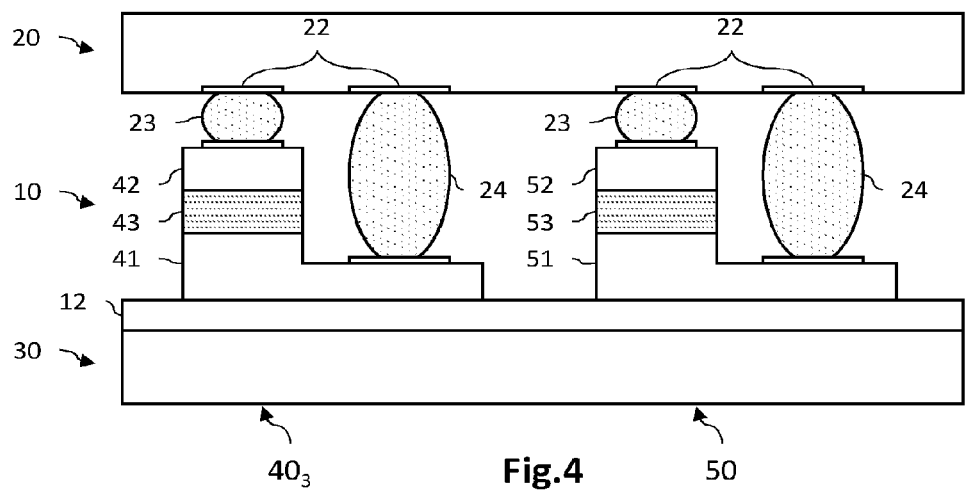
FIG. 4 is a schematic and cross-sectional partial view of an optoelectronic device according to another embodiment, in which the link between the optoelectronic chip and the control chip is ensured by electrically conductive balls.

FIG. 4 is a partial schematic cross-sectional view of an optoelectronic device according to another embodiment, in which the electrical link between the control chip and the optoelectronic chip is produced by electrically conductive balls 23, 24 and not by means of the electrical coupling layer and of the electrical connection elements. The space delimited between the optoelectronic chip and the control chip can be filled by a dielectric and preferably thermally conductive material (not represented). In this example, the lateral flanks of the diodes 40, 50 are not necessarily covered by dielectric portions 47, 57 illustrated in FIGS. 2 and 3.

FIGS. 5a to 5h illustrate steps of a method for producing an optoelectronic device as represented in FIG. 2. This example is similar to that described in the patent application FR1456085 filed on 27 Jun. 2014, the text of which is considered to form an integral part of the present description.

Figure 5A:
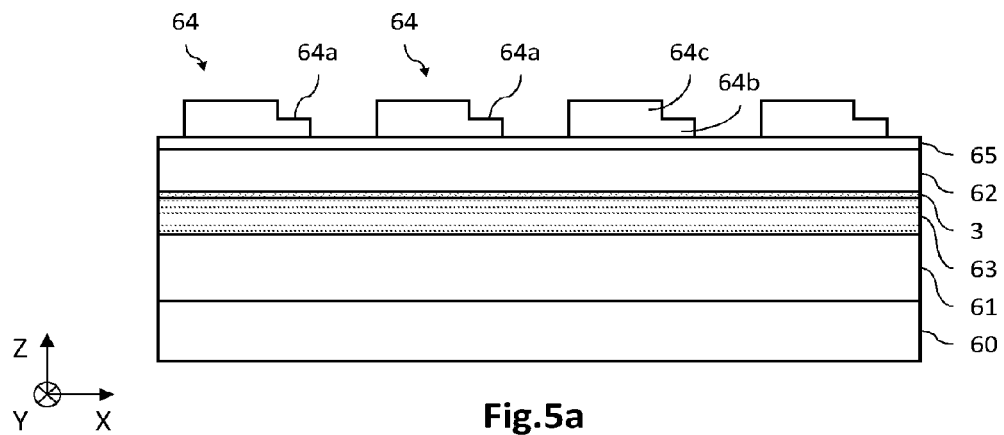

Referring to FIG. 5a, there is produced, on a growth substrate 60, a stack formed by a semiconductive layer 61 doped according to a first type of conductivity, for example of N type, an active layer 63 comprising at least one quantum well, a first N-doped intermediate layer 3 (and possibly a second P-doped intermediate layer 4, not represented), and a semiconductive layer 62 doped according to a second type of conductivity opposite to the first type, for example of P type. The free surface of the P-doped layer 62 is then coated with an electrically conductive layer 65, for example of aluminium or of silver. These stacked layers are intended to form the first N-doped portions 41, 51, the active zones 43, 53, the first N-doped intermediate portions 3 and the second P-doped portions 42, 52 of the light-emitting diodes and of the Zener diode, as well as the conductive portions 45, 55. It should be noted that the N-doped layer 61 can comprise a first strongly N+-doped part covering the substrate and a second part covering the first, and exhibiting a lower doping level. The two parts of the N-doped layer 61 can be produced in one and the same material or in two different materials mostly comprising the same semiconductor compound. Moreover, the growth substrate can be of an insulating material, for example sapphire, or of a semiconductive material, for example silicon, or based on a III-V or II-VI material.

Structured hard mask blocks 64 are then deposited. The blocks 64 have a structure forming a setback 64a on a lateral flank. Thus, each block 64 comprises a first part 64b, forming a base which rests on the conductive layer 65, the lateral dimensions of which subsequently define those of the second part 41b, 51b of the N-doped portions 41, 51 of the diodes 40, 50. It comprises a second part 64c, which extends from the first part 64b, the lateral dimensions of which subsequently define those of the first part 41a, 51a of the N-doped portions, of the active zone 43, 53 and of the P-doped portion 42, 52 of the diodes. The thicknesses of the two parts of the hard masks are chosen as a function of the rate of etching of the different materials of the stack of layers.

Figure 5B:
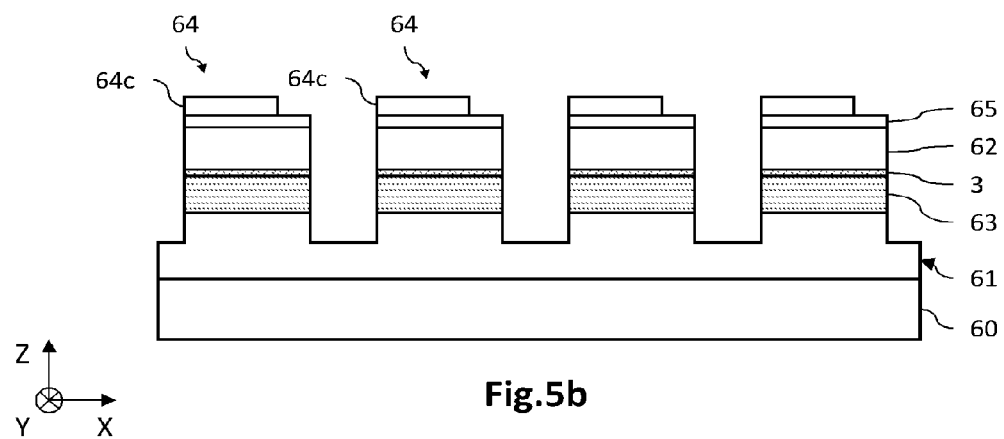

Referring to FIG. 5b, the stack of the conductive layer 65, of the P-doped layer 62, of the N-doped intermediate layer 3, of the active layer 63, and of a part of the N-doped layer 61 is etched, from the exposed surface of the stack between the hard mask blocks 64. The setback-forming part 64a of the hard mask blocks is also etched in this step. The etching is a dry etching, such as a reactive ion etching or a plasma etching.

Figure 5C:
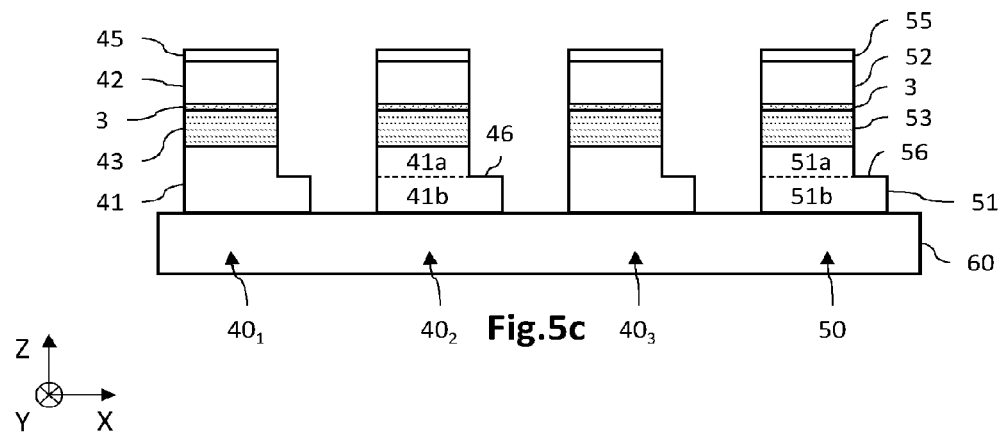

Referring to FIG. 5c, the etching is continued from the exposed surface of the stack not covered by the hard mask blocks 64. Thus, a plurality of coplanar mesa structures is obtained, each formed by a stack of a conductive portion 45, 55 of a P-doped portion 42, 52, of an N-doped intermediate portion 3, of an active zone 43, 53, and of an N-doped portion 41, 51 having a setback 46, 56 between a first part 41a, 51a in contact with the active zone and a second part 41b, 51b covering the substrate 60. The first part 41a, 51a of the N-doped portion has lateral dimensions in the plane (X, Y) less than those of the second part 41b, 51b so as to form the setback surface 46, 56. Preferably, the mesa structures intended to form light-emitting diodes have lateral dimensions greater than those of the adjacent mesa structures intended to form Zener diodes, so as to thus maximise the total emission surface of the optoelectronic device 1. The conductive portions have an exposed surface, that is to say free of any hard mask residues.

Referring to FIG. 5d, the insulating portions 47, 57 are produced, arranged in the spaces between the mesa structures and covering the lateral flanks thereof, except for the setback surfaces 46, 56. The insulating portions can be obtained by a conformal deposition of a layer of a dielectric material, for example of SiN with a thickness between 3 nm and 100 nm, continually covering the mesa structures and the exposed surface of the substrate. Only the portions situated on the lateral flanks of the mesa structures are then retained by performing a dry etching of the portions of the dielectric layer situated between the mesa structures, on the setback surfaces and on the face of the conductive portions.

Optionally, it is possible to produce, by conventional lithography, etching and conformal deposition steps, for example by the cathodic sputtering or chemical vapour deposition technique, a film (not represented) of a material that is reflective with respect to the excitation wavelength, for example of aluminium or of silver, covering the exposed surface of the insulating portions 47 covering the lateral flanks of the mesa structures intended to form light-emitting diodes 40, of a thickness for example less than 50 nm for aluminium and less than 75 nm for other suitable materials such as silver. A dry etching is possibly performed to once again expose the surface of the conductive portions, and electrically insulate the conductive portions of the reflective or absorbent films with insulating portions. In the case where the reflective films are electrically conductive, they can cover the corresponding setback surfaces.

Referring to FIG. 5e, the lateral connection elements 48, 58 are formed by filling the space situated between the mesa structures. For that, a full-plate deposition of an electrically conductive material is performed, followed by a chemical mechanical planarization and/or an etching, for example an RIE etching, to as to eliminate the deposited conductive material covering the mesa structures and thus free the top face of the conductive portions 45, 55 and that of the insulating portions 47, 57. The top face obtained is then substantially planar.

Referring to FIG. 5f, an electrical coupling layer 13 is produced covering the top face of the structure obtained on completion of the preceding step, the coupling layer is formed by a dielectric material 15 surrounding connection elements 14 (here referenced $14_1$, $14_2$, $14_3$, $14_4$) which extend between the two opposing faces of the layer 13 and come into contact with the conductive portions 45, 55 and with the lateral connection elements 48, 58. For that, a dielectric layer is deposited on the structure obtained, then, by lithography and etching, cavities are defined intended to receive the connection elements. These cavities are then filled by a full-plate deposition of an electrically conductive material, for example copper or aluminium, followed by a chemical mechanical planarization. The coupling layer 13 has a substantially planar free face suitable for a bonding, for example direct, with a control chip.

Figure 5G:
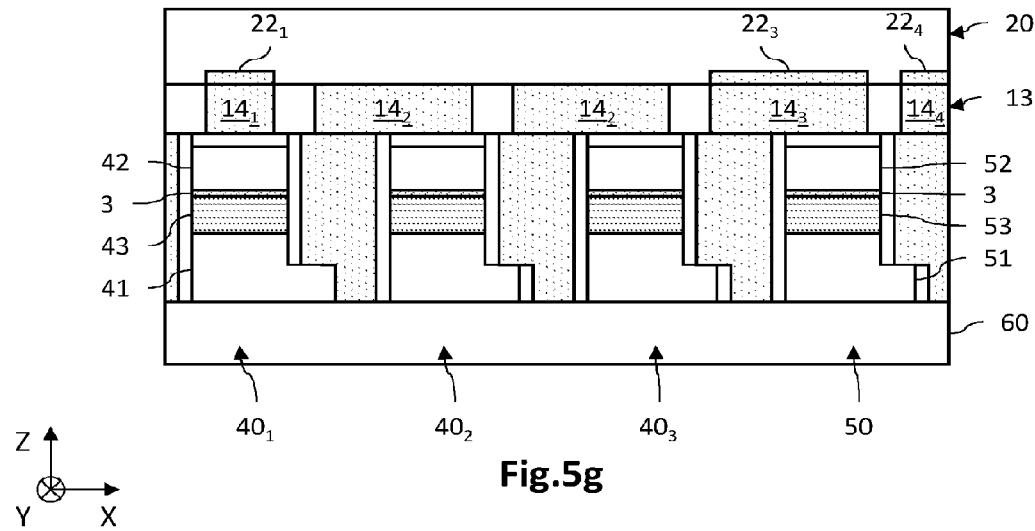

Referring to FIG. 5g, the structure obtained previously is fixed to a control chip 20 on the free surface of the coupling layer 13. The control chip comprises electrically conductive biasing portions 22 (here referenced $22_1$, $22_3$, $22_4$) coming into contact with the connection elements $14_1$, $14_3$, $14_4$ of the coupling layer 13. The fixing can notably be ensured by a direct bonding, or bonding by molecular adhesion, between the respective metal surfaces of the optoelectronic chip and of the control chip, and between the respective dielectric surfaces of the two chips. Alternatively, a fixing by electrical connection microballs and/or by thermocompression can also be performed.

Figure 5H:
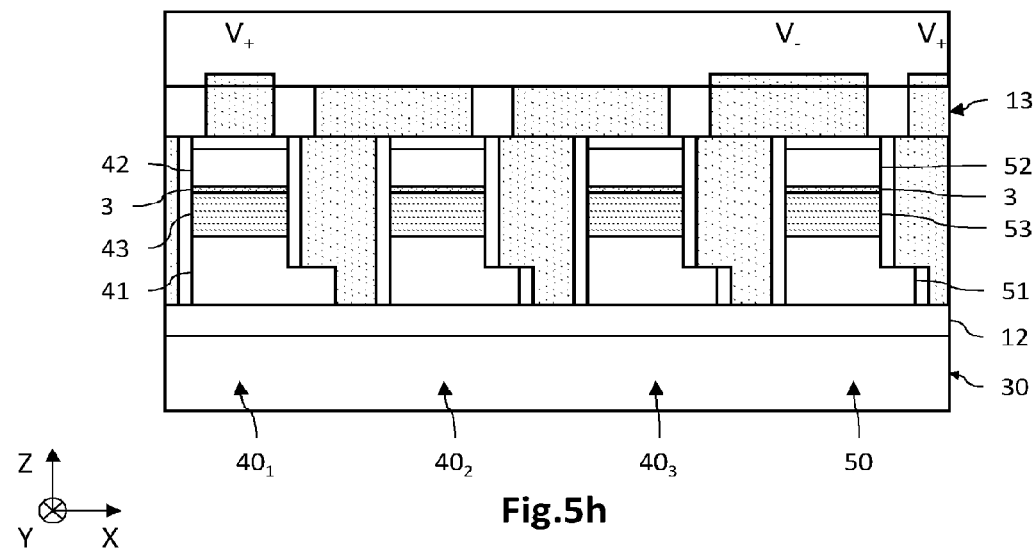

Referring to FIG. 5h, the growth substrate 60 is removed, for example by chemical mechanical planarization and/or a dry etching, so as to expose the top face of the optoelectronic chip comprising the surfaces 44, 54 of the diodes 40, 50.

The top face of the optoelectronic chip is then covered with a layer 12 of a dielectric material that is then planarized for example by chemical mechanical means. The free face of the layer 12 can be locally structured so as to form relief patterns arranged facing the emission surfaces 44 and possibly surfaces 54. Finally, a cap 30, formed by a plate produced in a transparent material, is fixed onto the front face of the optoelectronic chip.

The production method described here thus makes it possible to obtain an optoelectronic device in which the light-emitting diodes and the Zener diode or diodes are integrated monolithically and obtained simultaneously.

Particular embodiments have just been described. Different variants and modifications will become apparent to those skilled in the art.

Thus, the embodiments described previously mention a first N-doped portion comprising a setback surface and a P-doped portion situated facing the control chip. The types of conductivity of the doped portions can of course be reversed.

The optoelectronic device can also comprise several sets of light-emitting diodes connected in series, of which each set is connected by a Zener diode or a pair of Zener diodes connected head-to-tail. The number N of each set of light-emitting diodes connected in series is adapted according to the breakdown voltage value of the corresponding Zener diode, this value being able to be adjusted by the doped intermediate portion or portions 3, 4.

The invention claimed is:

1. An optoelectronic device, comprising:
   a plurality of light-emitting diodes, each exhibiting a threshold forward Voltage and a reverse breakdown voltage in a material comprising a same semiconductor compound, said plurality being arranged such that:
   N light-emitting diodes of said plurality, where N ≥2, are connected in series and are configured to be forward-biased, and
   at least one light-emitting diode of said plurality is connected in parallel to the N light-emitting diodes and is configured to be reverse-biased and to form a Zener diode,
   wherein a sum of threshold voltages of each of the N light-emitting diodes is less than a value of a breakdown voltage of the formed Zener diode, and
   wherein the plurality of light-emitting diodes comprises a stack of semiconductive portions comprising a first portion doped according to a first type of conductivity, a second portion doped according to a second type of conductivity opposite to the first type, and a first intermediate portion doped according to the first type of conductivity, the first intermediate portion being disposed between said first and second portions and having a doping level such that the breakdown voltage is greater than the sum of the threshold voltages of each of the N light-emitting diodes.

2. The optoelectronic device according to claim 1, wherein the semiconductive portions of the stack are respectively coplanar and are a material of a same composition and having a same doping level.

3. The optoelectronic device according to claim 2, wherein the first intermediate portion has a nonzero thickness less than or equal to 5 nm.

4. The optoelectronic device according to claim 1, wherein the semiconductive portions of the stack further comprise a second intermediate portion doped according to the second type of conductivity, disposed between the first intermediate portion and the second portion, and having a doping level such that the breakdown voltage is greater than the sum of the threshold voltages of each of the N light-emitting diodes.

5. The optoelectronic device according to claim 4, wherein the semiconductive portions of the stack are respectively coplanar and are a material of a same composition and having a same doping level, and have a nonzero thick mess less than or equal to 50 nm.

6. The optoelectronic device according to claim 1, wherein the semiconductor compound is chosen from a III-V compound, a II-VI compound, and a IV element or compound.

7. The optoelectronic device according to claim 1, wherein the semiconductive portions of the stack further comprise an active layer disposed between said first and second portions, the stack forming a substantially coplanar mesa structure.

8. The optoelectronic device according to claim 7, wherein the first portion of said stack has a lateral flank comprising a setback surface formed by a second part of the first portion with respect to a first part thereof.

9. The optoelectronic device according to claim 8, further comprising a lateral electrical connection element extending at a level of the plurality of light-emitting diodes, being in electrical contact with the setback surface, being electrically insulated from an adjacent second portion of said stack and from an adjacent active portion of said stack by dielectric portions covering the lateral flank.

10. A method for producing the optoelectronic device according to claim 1, the method comprising:
   forming the plurality of light-emitting diodes in the material comprising the same semiconductor compound;
   connecting in series the N light-emitting diodes of said plurality such that said diodes are configured to be forward-biased; and
   connecting at least one light-emitting diode of said plurality in parallel to the N light-emitting diodes such that said at least one diode is configured to be reverse-biased and to form the Zener diode.

11. The method according to claim 10, wherein the step of forming comprises:
   producing a stack of layers comprising a first doped semiconductive layer and a second doped semiconductive layer between which is inserted an active layer;
   etching the stack of layers, so as to form a first mesa structure to form the N light-emitting diodes, and so as to form a second mesa structure to form the Zener diode, each mesa structure being formed by a stack of a first doped portion, an active zone, and a second doped portion, the first doped portion of each of said mesa structures comprising a lateral flank having a setback surface;
   producing dielectric portions covering the lateral flanks of said mesa structures except for the setback surfaces; and depositing an electrically conductive material between said mesa structures, the electrically conductive material being in contact with the setback surfaces and being electrically insulated by the dielectric portions from the active zone and from the second doped portion.

12. The method according to claim 11, wherein the step of producing the stack of layers further comprises producing the first intermediate layer doped according to the first type of conductivity, disposed between the active layer and the second doped portion.

13. The method according to claim 12, wherein the step of producing the stack of layers further comprises producing the second intermediate layer doped according to the second type of conductivity, disposed between the first intermediate layer and the second doped portion.

14. The method according to claim 12, wherein a doping level of the first intermediate layer is adjusted such that the breakdown voltage of the formed Zener diode is less than the sum of the threshold voltages of said each of the N light-emitting diodes.

15. The method according to claim 13, wherein a doping level of the second intermediate layer is adjusted such that the breakdown voltage of the formed Zener diode is less than the sum of the threshold voltages of said each of the N light-emitting diodes.

16. The method according to claim 11, further comprising producing electrical connection elements configured to forward-bias the N light-emitting diodes and to reverse-bias the formed Zener diode through electrically conductive portions disposed facing the second doped portions.

* * * * *